United States Patent [19]

Dvorak et al.

[11] 4,011,980
[45] Mar. 15, 1977

[54] FLOW-OVER MASS SOLDERING
[75] Inventors: Howard A. Dvorak, Brookfield; William R. Studnick, Bolingbrook, both of Ill.
[73] Assignee: Western Electric Company, Inc., New York, N.Y.
[22] Filed: Mar. 25, 1976
[21] Appl. No.: 670,466
[52] U.S. Cl. ............................ 228/180 R; 228/37; 228/257
[51] Int. Cl.² .......................................... H05K 3/34
[58] Field of Search ............... 228/180, 34, 36, 37, 228/40, 257–261

[56] References Cited
UNITED STATES PATENTS
3,921,888  11/1975  Elliott et al. .................... 228/37 X FOREIGN PATENTS OR APPLICATIONS
469,519  5/1913  France ................................ 228/37

Primary Examiner—James L. Jones, Jr.
Assistant Examiner—K. J. Ramsey
Attorney, Agent, or Firm—R. P. Miller

[57] ABSTRACT

A printed wiring board is oriented with a wiring surface facing up for mass soldering. Molten solder is pumped from a tank onto a trough and flows in a thin, wide stream across the upper surface of the printed wiring board which is held down to prevent the board from floating on top of the solder.

10 Claims, 14 Drawing Figures

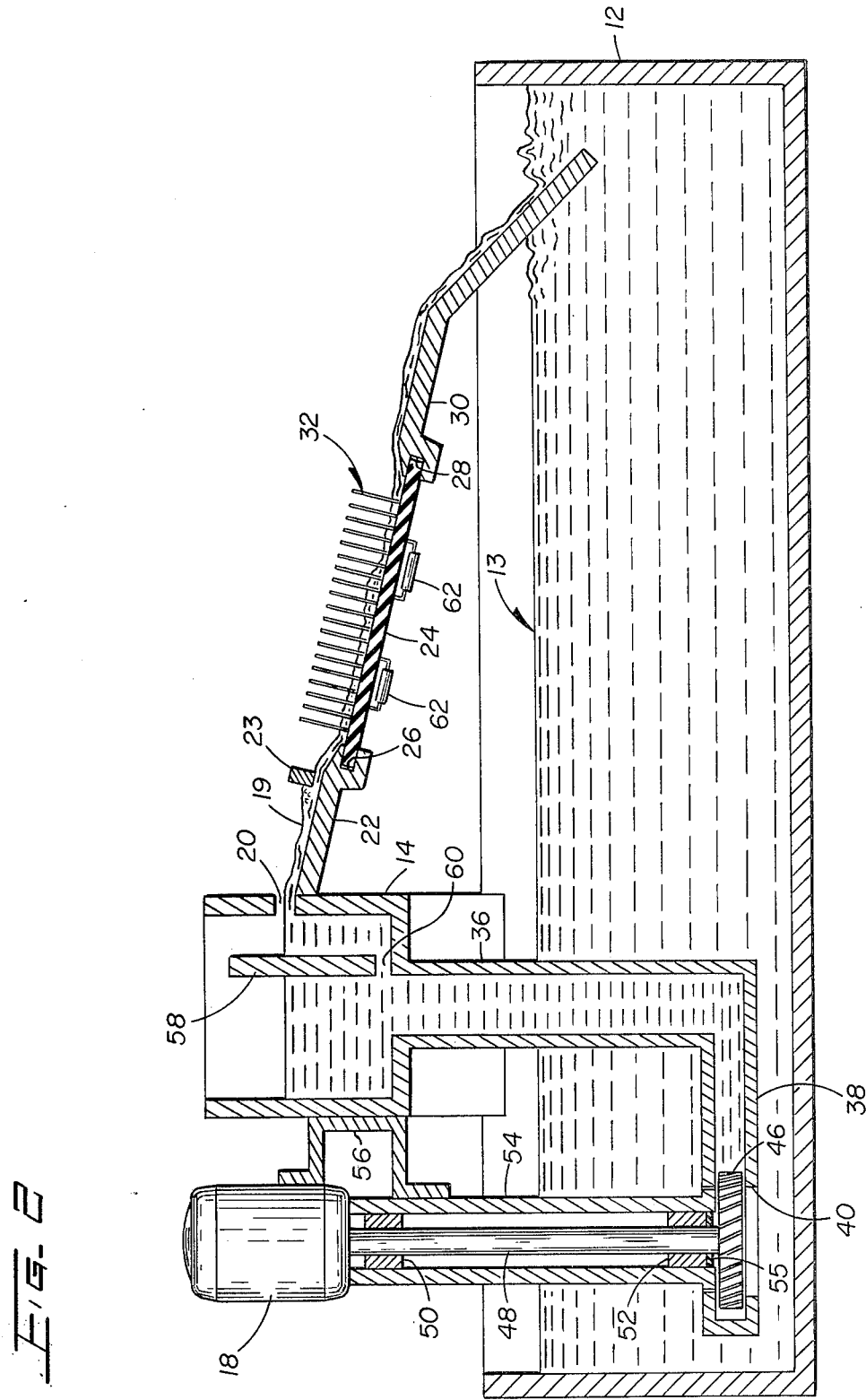

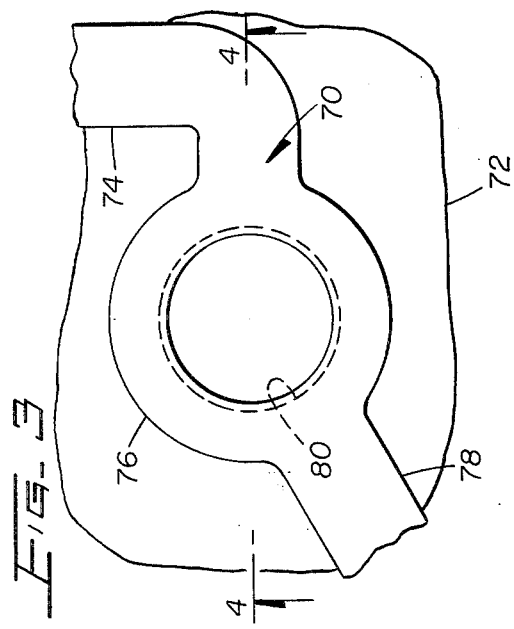
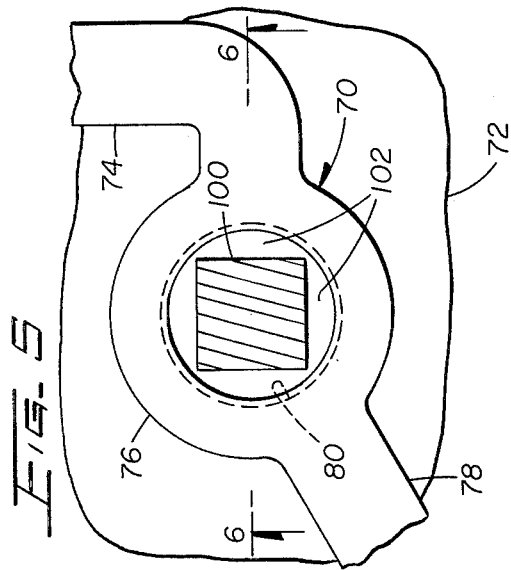
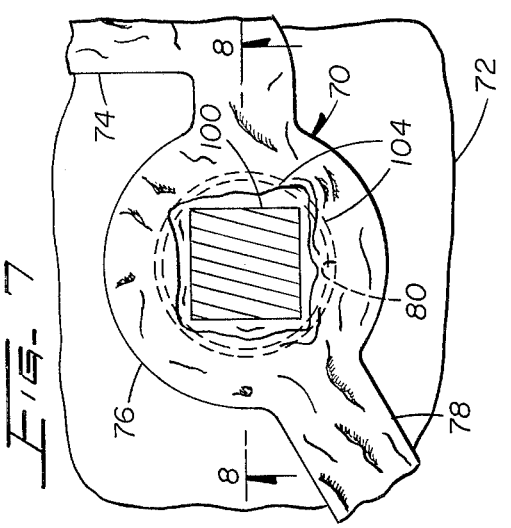
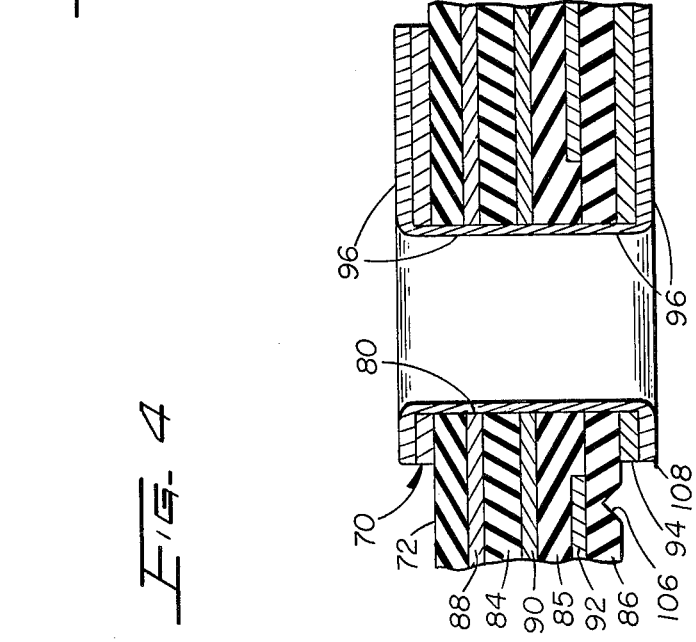
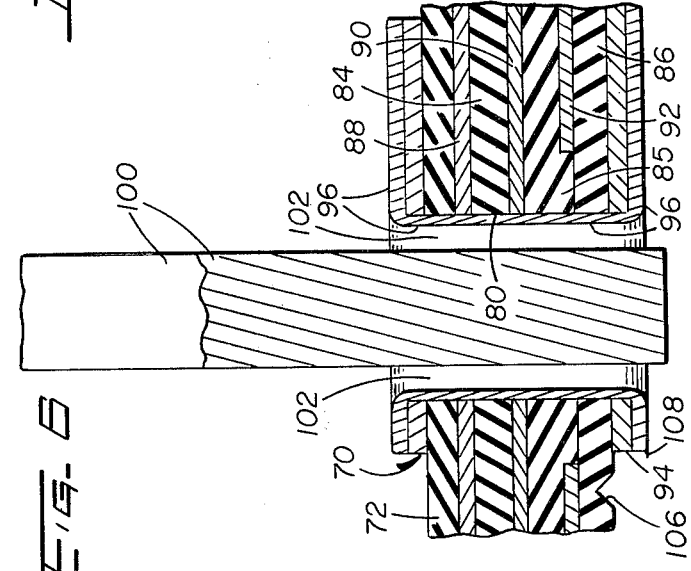
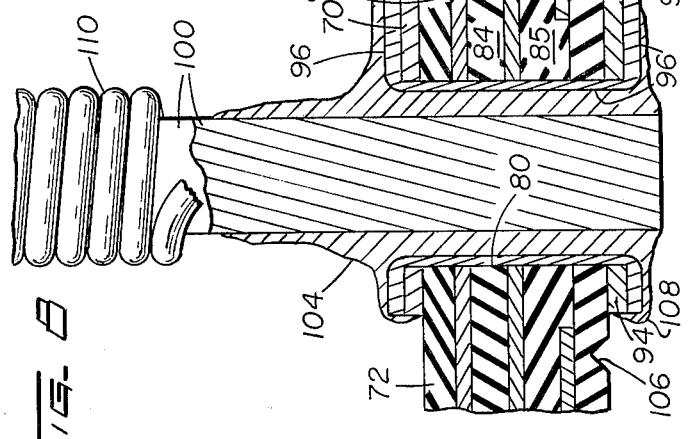

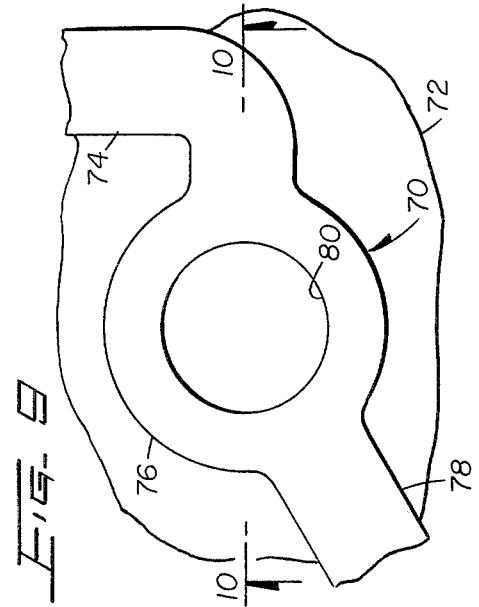
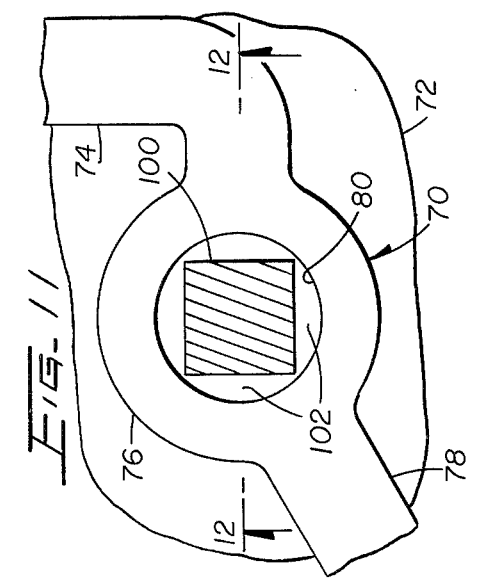
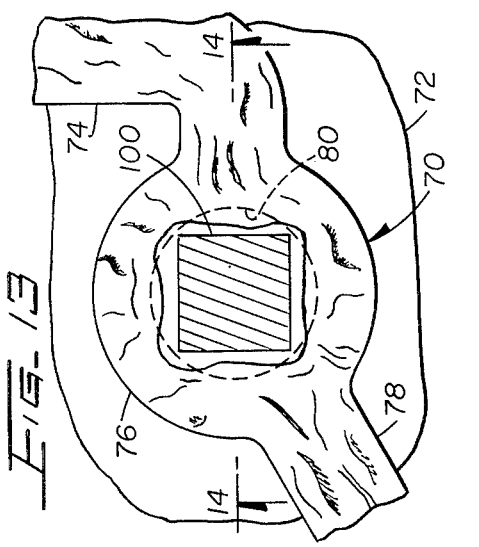
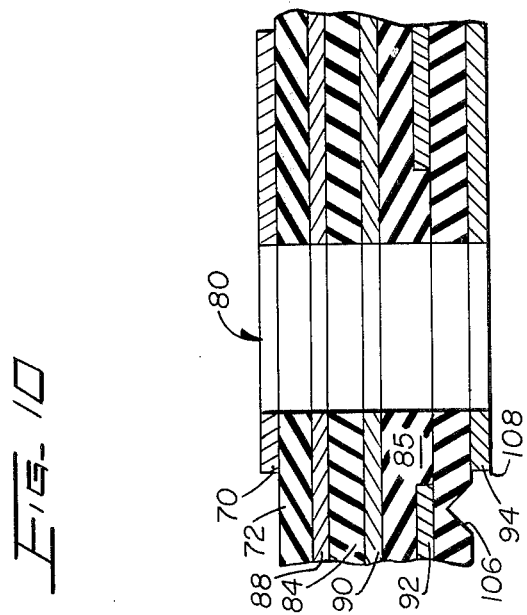
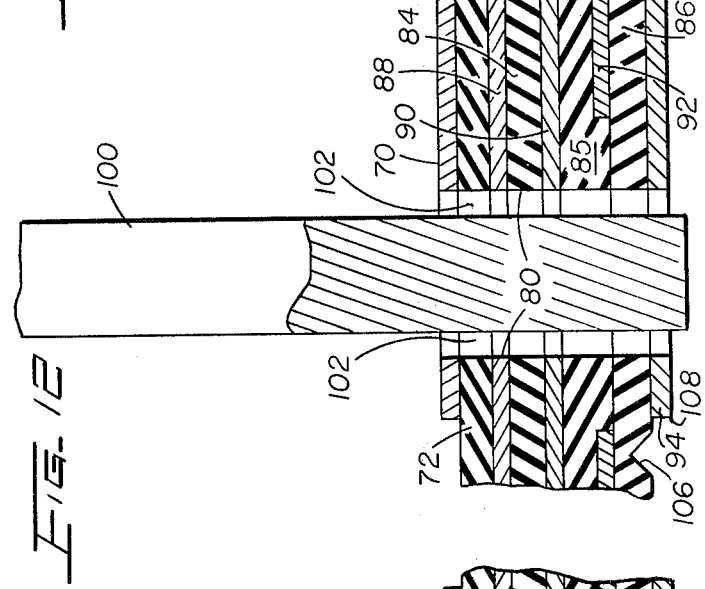
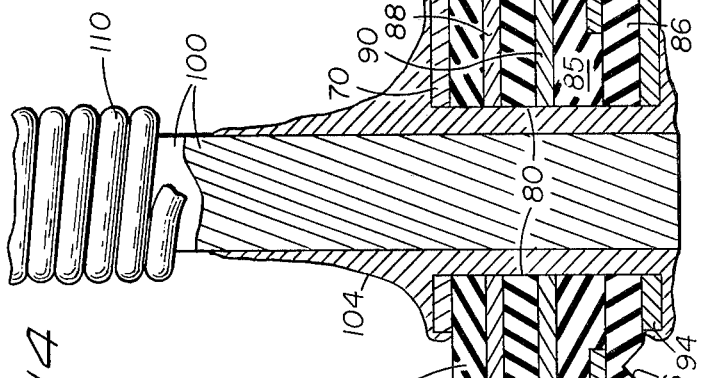

FLOW-OVER MASS SOLDERING

Field of the Invention

The present invention relates to mass soldering of printed wiring boards.

BACKGROUND OF THE INVENTION

Conventional mass soldering of printed wiring boards is of many types. Wiring boards with the circuit components inserted are sometimes floated on a bed of molten solder in a heated tank. Molten solder is sometimes made to form one or more waves, and the board is passed over these waves. The molten solder can also be pumped at a substantial pressure to play in streams onto the bottom of a printed wiring board as it passes over a series of solder nozzles.

Mass soldering by these techniques has certain advantages and disadvantages. It is relatively inexpensive; however, solder comprises a mixture of tin and lead in proportions suitable for the particular soldering job intended, and, at the elevated temperatures of soldering operations, tin and lead have a tendency to oxidize in the atmosphere. The oxides of tin and lead are generally lighter than the unoxidized metals and tend to float on top of the molten mass of solder with other impurities. This floating matter is referred to by the general term "dross." When the bottom of the circuit board touches the top of the surface of solder, the solder dross may become a part of the soldering mechanism. This is very detrimental to the quality of the resulting solder joint. Dross tends to impede wetting and also causes pin-holes and other imperfections in the solder.

When the printed wiring board separates from the hot solder, drops of molten solder tend to hang down as projections or stalactites of solder descending from the printed wiring pattern and generally from wires or terminal pins or posts that extend through the printed circuit wiring board. These projections, known as icicles when solidified, extend generally in a direction perpendicular to the plane of the board and are generally pointed so as to constitute a safety hazard to anyone subsequently handling the board. If not removed, a solder projection may break off inside an equipment cabinet and may short or otherwise interfere with the circuits in large, complex installations.

If wire-wrap binding posts or terminals are mounted on the wiring side of the board, these wiring posts also get a coating of solder when soldered by conventional mass-soldering techniques. This is generally not desirable since the binding posts are sometimes lightly gold plated for good electrical contact, and a secure connection by the wire-wrap technique depends upon the sharp corners of the square post biting into the surface of the wire as it is wrapped about the post. Soft solder on the surface of a post tends to oxidize and impede good contact as well as cushion the sharp edges and limit the desired biting necessary for a good connection. If a solder-free portion is to be maintained on the binding posts, it must be masked with a solder resist; and the resist must be removed after soldering. These additional steps of masking and mask removal undesirably add cost to circuit manufacture.

When wiring patterns are provided on both sides of an insulated substrate or even in several layers throughout the thickness of the board, the electronic components are generally mounted on only one side of the board. Reliable connections from the lands of the wiring pattern on one surface of the board to the lands of another wiring pattern on another surface of the board are usually made through the holes into which component leads are inserted. Such connections are also often made by special rivets, braids or other connectors inserted in the board. Using special, inserted interconnect devices is very costly of material, labor and machine time.

Alternatively, copper is plated onto the insides of the holes linking the two or more printed wiring patterns. Typically, a thin coating of copper is electroless plated onto the entire surface of the perforated or drilled, copper-clad laminate including the insides of the holes. More copper is then electroplated all over the board including through the holes. Solder is then selectively plated in the desired circuit pattern or uniformly plated and selectively removed so as to leave an etch resist of solder in a circuit pattern on both of the exposed copper surfaces and on the plated copper that extends through the holes in the board. The board is then etched to remove the exposed copper and leave the solder-plated wiring pattern on both sides of the board plus the through-hole plated-copper interconnections. The leads of the circuit components are then inserted through the holes, and the board is subsequently mass soldered.

In the case of a multi-layer board, each intermediate circuit at a different stratum between the two surfaces of the board can make contact with the plated-copper through-hole connection. A circuit makes contact with the plated-copper through-hole connection by extending to the edge of the hole so the edge of the copper of the circuit forms part of the surface upon which the through-hole copper is plated. This through-hole plating technique involves a rather expensive two-step copper plating process in the manufacture of printed wiring boards.

When soldered by conventional mass soldering methods, the various through-hole connections depend upon capillary action to draw molten solder along the component lead from one side of the board to the other. This technique is nominally free of additional cost in a mass-soldering operation. However, plated through-hole connections are notorious for gaps or cracks in the copper cylinder that extends from one side of the board to the other, through the hole. Therefore, it is standard practice in the electronics manufacturing industry to require a solder fillet on the upper side of the board. A solder fillet on the top of the board is an indication that solder extends all the way through the hole and has bridged any cracks or gaps in the through-hole plating — thereby assuring good electrical continuity. Full solder flow through the length of the hole also assures good physical strength, in the case of a wire-wrap terminal post, to withstand the strains of the wire-wrap operation.

However, to draw solder from the bottom surface of the board so as to form a solder fillet with the copper on the upper surface requires a suitable capillary clearance or gap. If the maximum capillary clearance is less than about 0.003 inch, it has generally been found that flux vapors do not readily escape. This causes holes and voids in the solder. If the maximum capillary clearance is greater than about 0.005 inch, the solder is less likely to rise through the hole in the board since the wider the capillary clearance, the weaker the overall capillary lifting capability. With a range of ideal capillary clearance of from 0.003 to 0.005 inch, manufacturing tolerances on the pin or post and the plated-through hole become undesirably restrictive and thus quite costly.

In an effort to allow greater tolerance and greater clearance, tiny doughnut-shaped preformed rings of solid solder are manually or automatically placed over the wire and atop the desired soldering site. These preforms are then melted in situ by radiation, vapor condensation, or hot gas convection to flow down into the aperture in the wiring board. However, use of preforms entails a high price in material and labor or automatic machinery to put the relative expensive solid preforms into place prior to melting them. However, with preforms on top of the holes, the clearance can be made substantially larger than the ideal capillary clearance with resultant loosening of tolerances for the sizes of holes and pins, posts, terminals, or wire.

SUMMARY OF THE INVENTION

In accordance with the present invention, a printed wiring board is positioned with the wiring pattern to be mass soldered oriented generally in an upwardly direction. Molten solder flows over the printed wiring pattern. More particularly, the invention includes facilities for building the board at an angular inclination while a stream of solder is flowed over the exposed top surface to flow solder over circuit paths and component leads to be soldered, as well as into through-holes and any crevices or other difficult-to-solder places. The solder stream is recirculated so that non-dross solder is continually applied to all areas and places that are to receive a solder coating.

BRIEF DESCRIPTION OF THE DRAWINGS

A more complete understanding of the present invention may be had by referring to the following detailed description when considered in conjunction with the accompanying drawings wherein like reference numbers refer to the same or similar parts throughout the several views in which:

FIG. 2 is a cross-sectional view taken along the line 2—2 of FIG. 1;

FIG. 3 is a fragmentary top view showing a land area on a printed wiring board and with a plated-through, discrete-component-lead or binding-post insertion hole therein;

FIG. 4 is a fragmentary, cross-sectional view taken along the line 4—4 of FIG. 3;

FIG. 5 is the same view shown in FIG. 3 but illustrating a square, wire-wrap binding post inserted in the hole; pin 100 now drawn correctly: corners are contacting side of hole. See FIG. 6.

FIG. 6 is a fragmentary cross-sectional view taken along line 6—6 of FIG. 5;

FIG. 7 is the same view shown in FIG. 5 but after the printed wiring board has been soldered in the apparatus illustrated in FIGS. 1 and 2; same comment as FIG. 5 should be shown in FIG. 8;

FIG. 8 is a fragmentary cross-sectional view taken along line 8—8 of FIG. 7; and FIGS. 9–14 are the same as FIGS. 3–8, respectively, but without the plated-through connection. Same comments on FIGS. 11 and 13.

DETAILED DESCRIPTION

Figure 1:
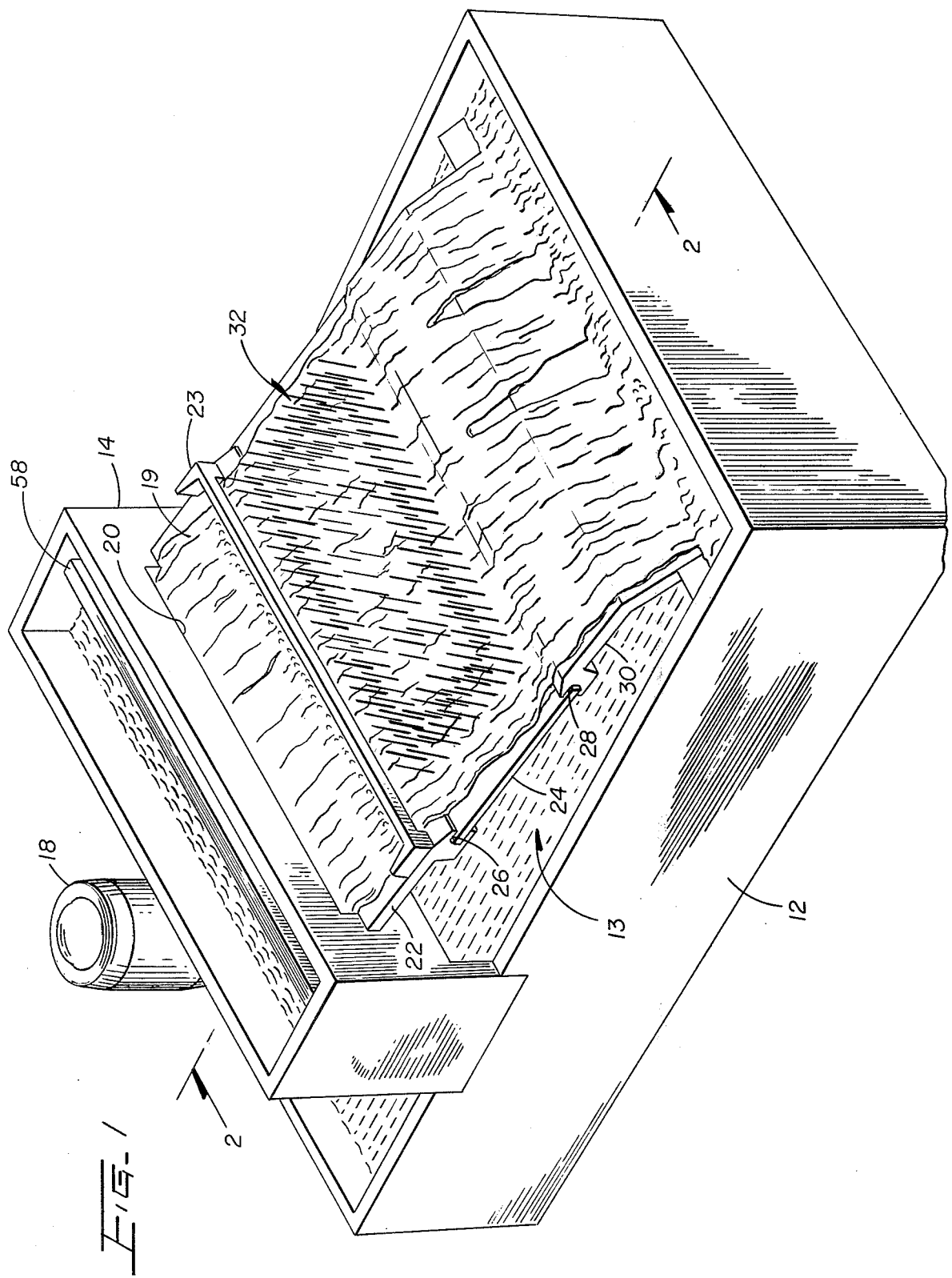
FIG. 1 is a perspective view of a mass soldering apparatus embodying the present invention.

Referring now to the drawings and more particularly to FIG. 1, there is shown a heated tank 12 filled with molten solder 13 at a temperature suitable for mass soldering of printed wiring boards. A reservoir 14 is mounted on top of the tank 12, and a motor 18 pumps solder up into the reservoir 14. The height of the solder in the reservoir 14 is controlled by the speed and capacity of the motor 18 and its associated pump.

The solder flows in a flat, ribbon-like stream 19 through a rectangular orifice 20, down a ramp or trough 22 under a final dross skimmer 23, and over a printed wiring board 24 that is held in place by a groove 26 in the trough 22 and also by a groove 28 in a trailing ramp or trough 30. The board 24 is slidable along the grooves 26 and 28 for insertion and withdrawal. A plurality of wire-wrap terminals or binding posts 32 project upward from the board 24 and through the stream 19. The stream 19 then continues over the trailing trough 30 and back into tank 12.

Referring now to FIG. 2, the tank 12 is shown in cross-section along the line 2—2 of FIG. 1. The reservoir 14 is shown to include a tube 36 extending down from the bottom of the reservoir 14 and terminating in a pump housing 38 which has an opening 40 near the bottom of the tank 12 in order to admit solder to an impeller 46 mounted on a shaft 48. The motor 18 rotates the shaft 48 and the impeller 46 draws molten solder through the opening 40 and out into the interior of the housing 38. The pressure produced in the solder by the impeller 46 causes the molten solder to rise from the interior of the impeller housing 38, up through the tube 36, and into the interior of the reservoir 14. The shaft 48 rotates in two bearings 50 and 52 mounted in a support tube 54 that is pressed or screwed to and extends from the housing 38 up to and supports the motor 18. A seal 55 keeps solder from damaging the bearing 52 and the bulk of the shaft 48. A bracket 56 supports the motor 18 and the support tube 54 on the framework on the reservoir 14.

A blocking plate 58 extends from end-to-end of the reservoir 14 with only a small opening 60 between the blocking plate 58 and the bottom of the reservoir 14. The blocking plate 58 serves to skim the majority of the dross from the solder before it can flow through the opening 60 and out through the orifice 20.

The stream 19 of solder accelerates down the trough 22 and after passing under the final dross skimmer 23, flows over the board 24 and mass solders the connections on the board 24 before more dross can form. If the board 24 were not in place, the stream 19 of solder would flow down the trough 22 and back into the center of the tank 12. However, when the board 24 is in the position shown in FIG. 2, it diverts the solder so that the solder virtually falls onto the top surface of the board 24 which is oriented in a generally upward-facing direction but at a slight angle so that the solder flows along the surface of the board 24 and over the trailing trough 30, back to the tank 12. After soldering, the board 24 is removed; and the solder again falls from the trough 22 into the center of the tank 12. However, the solder stream 19 may also be interrupted or diverted to the tank 12 by other means. Alternatively, the motor 18 may be shut off or disconnected from the impeller during removal of the board 24.

It can be seen that the level of the stream 19 rises only very slightly up the length of the terminals or binding posts 32. This level of the stream 19 is controlled directly by the height of the molten solder in the reservoir 14, by the speed and capacity of the motor 18, and by the angle of incline of trough 22.

Electronic components can readily be included in the mass soldering of the board 24, as illustrated by the component 62 shown suspended from the bottom of the board 24. Techniques are known for inserting a component 62 in such a way that it will be held physically to the board 24 without falling out prior to soldering. One of these techniques involves slightly bending or crimping the component leads toward the printed wiring or land areas somewhat as the legs of a staple are bent to grip paper — only not quite so severely.

Referring now to FIG. 3, a very small fragment of a printed wiring board is shown greatly enlarged. A thin copper conductor 70 is shown bonded to the surface of an insulating substrate 72. The copper conductor 70 is formed by techniques well known to the prior art into a path 74, a termination or land area 76 and another path 78 being shown only for illustration. An aperture 80 (shown in dotted lines in FIG. 3) is formed in the center of the land area 76, customarily by drilling or punching. Component leads and binding posts are normally inserted into the printed wiring board through apertures such as the aperture 80.

Referring now to FIG. 4, the fragment of a printed wiring board illustrated in FIG. 3 is shown in cross-section. This printed wiring board can be seen in FIG. 4 to be of a newer, more complex type now known to the prior art as a multi-layer board. The conductor 70 is seen bonded to the upper surface of the insulating substrate 72. In addition, there are three other insulating substrates 84, 85 and 86 making up the sandwich that comprises the printed wiring board. Another copper conductor 88 is shown bonded to and sandwiched between the insulating substrates 72 and 84. Similarly, another copper conductor 90 is shown bonded between the substrates 84 and 85. Still another copper conductor 92 is bonded between the substrates 85 and 86 but does not extend near the aperture 80. Finally, another copper conductor 94 is bonded to the bottom surface of the substrate 86.

An examination of the copper conductors of FIG. 4 will show that the conductors 70, 88, 90 and 94 are all intended to be interconnected at the aperture 80, and the conductor 92 is not intended to be included in that interconnection.

Copper is plated over the exposed conductors 70 and 94 and through the aperture 80. Typically, the plating is done by first electroless plating a thin layer of copper over both surfaces of the copper-clad laminate before the copper surfaces are formed into wiring patterns. This thin layer even extends inside of the apertures such as the aperture 80 and makes intimate contact with any conductor that extends into the aperture 80 such as the conductors 88 and 90. A thickness of copper is then electroplated over the electroless copper and is shown in FIG. 4 as the plating 96. The plating 96 may be selectively plated or may be plated uniformly over both copper surfaces. Preferably, solder (not shown) is selectively plated over the plating 96 to cover all areas that are to form a part of the desired wiring pattern, including the copper in the aperture 80. The copper that is unprotected by solder on either surface of the board is then etched away to leave the desired wiring pattern formed by the conductors 70 and 94 as well as the conductors 88, 90 and 92 which have previously been formed.

With copper the thickness of the conductor 70 plus the plating 96, undercutting often occurs in the etching process. This leaves slivers of solder overhanging the edges of the conductors. Overhanging solder slivers may break off and cause short circuits if not removed. They are very thin and can usually be absorbed by molten solder in a mass soldering operation.

Referring now to FIGS. 5 and 6, a square, wire-wrap terminal or binding post 100 is shown inserted into the aperture 80. The dimensions and tolerances of the aperture 80 and the terminal or binding post 100 are chosen so that the diagonal dimension of the post 100 will never be larger than the inside diameter of the copper plating 96 within the aperture 80. If an interference fit were to exist, there is risk that the force of insertion of the post 100 might cause delamination of the conductor 94 from the substrate 86. Therefore, typically, the terminal or binding post 100 is loose in the plated-through aperture 80 and is held by some fixturing (not shown) for soldering into the aperture 80.

Four gaps 102 exist between the flat sides of the terminal or binding post 100 and the arcuate sides of the aperture 80. These four gaps are not necessarily an ideal dimension at all points for capillary attraction to draw the solder up from a conventional surface of molten solder below the board. In fact, with economic tolerances, these gaps would have typical dimensions that make capillary flow very questionable.

Referring now to FIGS. 7 and 8, the same portion of the printed wiring board and terminal or binding post 100 are shown as are illustrated in FIGS. 5 and 6. However, FIGS. 7 and 8 illustrate the condition of the terminal or binding post 100 and the portion of the wiring board after the board has been passed through the soldering apparatus illustrated in FIGS. 1 and 2. Therefore, the conductor 70 is shown with a coating of solder 104 that extends up the sides of the terminal or binding post 100 to a height at least equal to the depth of the solder stream 19. The solder also extends down through the large gaps 102 to the bottom of the terminal or binding post 100 and makes intimate contact with and wets the plating 96 inside the aperture 80. Since solder can flow freely through the gaps 102, solder may extend quite a way along the plating 96 on the bottom conductor 94.

To block surplus solder from bridging from the conductor 94 to an adjacent conductor (not shown), a V-shaped groove 106 is preferably formed in the substrate 86 as a mask to block the flow of surplus solder that may exit from the bottom of the aperture 80. The prior art contains many techniques for blocking the flow of surplus solder, and the groove 106 is merely one of them. It can readily be appreciated that solder flowing along the plating 96 to an edge 108 of the bottom conductor 94 can readily remove the slivers of solder plating that may result at the edge 108 from the undercut etching of thick copper. Also, melting the solder that was plated over the copper plating 96 is desirable to achieve wetting of the copper surface.

It can be seen that an important aspect of the present invention is the use of gravity to aid the flow of molten solder into the gaps 102 rather than to rely on capillary action. In prior art techniques for mass soldering the conductors at an aperture 80, the printed wiring board is supported on top of a bed, wave or spray of molten solder. Capillary action is relied on to draw the molten solder up through the gaps 102 between the copper-plated aperture surfaces and through-hold pin or post and these gaps may or may not be ideally suited to capillary flow. When flux-core solder preforms are melted in place over apertures such as the aperture 80, gravity aid is achieved only at high material cost of the preform and high expense to place the preforms into their appropriate positions.

However, when solder is applied by flowing the molten mass of solder over the top of the printed wiring pattern, gravity aids solder penetration into the gaps 102, stalactites or projections are less likely to form, dross is held remote from the solder connection, and the solder wets and thus blunts only the bottoms of the corners of any square wire-wrap binding posts projecting from the board. This leaves ample length above the fillet of the solder 104 for attaching a conventional wrap of wire 110.

If a printed wiring board has been manufactured by a conventional mass-soldering technique and if stalactites or projections of solder extend perpendicular to the board, the previously-soldered wiring surface can be oriented in an upwardly facing direction and resoldered using the apparatus of FIGS. 1 and 2 to fuse or remove these projections of solder. However, care must be taken to prevent components from falling out of the board. Also, slivers of plated solder that overhang undercut areas of copper resulting from the etching process can similarly be fused and removed by orienting the solder-plated surface in an upwardly-facing direction and after etching, flowing solder over the surface using the apparatus of FIGS. 1 and 2.

Fluxing of the copper on the surface of the substrate 72 and the leads, posts, terminals, or pins that extend through apertures therein such as the aperture 80, may be accomplished by any of the prior art techniques or even by flowing flux rather than solder over the board using an apparatus such as that shown in FIGS. 1 and 2.

Referring now to FIGS. 9 through 14, a fragment of a printed wiring board is illustrated in the same way as is shown in FIGS. 3 through 8 with the exception that the plating 96 from FIGS. 3 through 8 has been omitted. This is to illustrate how the widening of tolerances and gravity assistance possible with the present invention may obviate the expensive, two-step electroless and subsequent electro-plating operation which is otherwise necessary to produce a copper through-connect cylinder in the aperture 80.

In FIGS. 3 through 8, the plating 96 made contact with each of the copper conductors 70, 88, 90 and 94 in order to achieve through-hole interconnection. The solder 102, in flowing through the gaps 102, assured complete electrical interconnection by bridging any cracks or openings in the copper plating 96 within the aperture 80. Since the gaps 102 can be enlarged using the present invention, capillary attraction of the solder along the copper through-hole connection is not needed. Therefore, the conductors 70, 88, 90 and 94 can be interconnected solely by the solder 104 which extends through the gaps 102 in the aperture 80 and wets each of the conductors 70, 88, 90 and 94 that extend into the aperture 80.

Although a particular embodiment of the invention is shown in the drawings and has been described in the foregoing specification, it is to be understood that other modifications of this invention, varied to fit particular operating conditions will be apparent to those skilled in the art; and the invention is not to be considered limited to the embodiment chosen for purposes of disclosure, and cover all changes and modification which do not constitute departures from the true scope of the invention.

What is claimed is:
1. The method of connecting lands on opposite sides of a printed wiring board to electrical terminals which have been inserted through apertures in the lands, and the board, which comprises:
   supporting the printed circuit board in a position at an inclination to the horizontal;
   flowing molten solder from an upper edge of the printed circuit board over an upwardly-facing surface of the board so that portions of the molten solder flow by gravity into the apertures and onto the lands on the underside of the board;
   interrupting the flow of molten solder over the upwardly facing surface of the printed circuit board after a predetermined time period sufficient to flow the solder onto the lands on the underside of the board; and
   permitting the molten solder in the holes in the printed circuit board to solidify to connect the lands of the board to the terminals in the holes.
2. The method of claim 1, which further comprises:
   providing means on a downward facing surface of the printed circuit board to preclude the flow of excess molten solder downward and out of the apertures in the board.
3. The method of claim 1, which further comprises:
   controlling the volume of flow of the molten solder to regulate the depth of the solder flowing over the upwardly facing surface of the printed wiring board, to limit the portions of the terminals which are exposed to the molten solder.
4. The method of claim 1 which further comprises:
   flowing the molten solder in a continuous circulating system along a first flow path;
   positioning the printed circuit board in its inclined position in a second flow path of the molten solder in the continuous circulating system;
   diverting molten solder from the first flow path to the second flow path to cause the molten solder to flow over the upwardly facing surface of the printed circuit board; and
   removing the printed circuit board from the second flow path after the predetermined time period, to interrupt the flow of the molten solder over the upwardly facing surface of the board.
5. The method of claim 4, which further comprises:
   skimming dross from the surface of the molten solder before the molten solder enters the first or second flow paths.
6. The method of claim 4, which further comprises:
   accelerating the flow of molten solder along the first flow path just prior to diverting the molten solder to the second flow path, to preclude the formation of dross on the surface of the solder and the flow of dross over the upwardly facing surface of the printed circuit board.
7. A method of soldering an upstanding terminal having an effective area into a printed wiring board having an underface provided with printed wiring thereon and a hole extending through the printed wiring and the board including the steps of:
   inserting the terminal through the hole in the board to the underface of the board said terminal being of such size so as to leave a gap between the terminal and the wall of the hole;
   orienting the board with the printed wiring facing in a generally downward direction; and flowing solder by gravity across the upper surface of the printed wiring board at a depth below the effective area of the terminal and through the gap onto the printed wiring.

8. The method of simultaneously fusing solder slivers and solder plating on a surface of a printed circuit board and connecting solder terminations extending through holes in the board to electrical terminals which have been inserted through the holes to project from opposite sides of the board while leaving gaps between the sides of the terminal and the walls of the holes.

supporting the printed circuit board with the surface containing the solder slivers and solder plating at an incline and with the surface upwardly exposed;

flowing molten solder across the upwardly exposed surface of the printed circuit board to melt the solder slivers and solder plating and surface portions of the solder terminations, and to gravity flow molten solder into the gaps about the terminals;

interrupting the flow of the molten solder over the upwardly exposed surface of the printed circuit board after the molten solder has filled the gaps in the board about the terminals; and solidifying the molten solder in the holes in the printed circuit board and about the terminals, including the melted surface portions of the solder terminations, to connect the terminations to the terminals.

9. A method of applying solder through holes formed in a circuit board wherein the holes are lined with copper which communicate with copper termination areas formed about the holes on opposite sides of the circuit board, and the board supports terminal pins extending through the holes while leaving gaps between the pins and the copper linings, which comprises:

supporting the boards in angular orientation with the terminal pins projecting from the board in an upward direction;

flowing a sheet of molten solder from an upper edge of the board and over the upper surface of the board to gravity flow the solder through the gaps between the terminal pins and the copper linings and then onto the copper termination areas on the underside of the board.

10. A method of soldering terminal posts to solderable conductors formed on the underside of a circuit board, which comprises:

forming holes extending through the circuit board and the conductors;

placing terminal posts in said holes, each of said terminal posts being square and having a diagonal dimension which is less than the diameter of the associated hole to provide gaps between the sides of the terminal and the wall of the hole;

mounting the board at an incline with conductors beneath the board;

flowing a ribbon-like stream of solder down the upper surface of the board for a time sufficient to gravity flow the solder through the gaps and onto the conductors; and then interrupting the flow of the stream over the board to allow the solder to solidify in the gaps and on the conductors.

* * * * *